US008497679B2

(12) United States Patent
Grodzki

(10) Patent No.: US 8,497,679 B2
(45) Date of Patent: Jul. 30, 2013

(54) MAGNETIC RESONANCE METHOD AND SYSTEM TO CREATE AN IMAGE DATA SET

(75) Inventor: David Grodzki, Hannover (DE)

(73) Assignee: Siemens Aktiengesellschaft, Muncih (DE)

( * ) Notice: Subject to any disclaimer, the term of this patent is extended or adjusted under 35 U.S.C. 154(b) by 299 days.

(21) Appl. No.: 13/020,306

(22) Filed: Feb. 3, 2011

(65) Prior Publication Data

US 2011/0187368 A1    Aug. 4, 2011

(30) Foreign Application Priority Data

Feb. 3, 2010    (DE) .......................... 10 2010 001 549

(51) Int. Cl.
*G01V 3/00*    (2006.01)
(52) U.S. Cl.
USPC ........................................................ 324/309
(58) Field of Classification Search
USPC ........................... 324/300–322; 600/410–435
See application file for complete search history.

(56) References Cited

U.S. PATENT DOCUMENTS 5,777,472 A    7/1998  Heid
5,926,022 A *  7/1999  Slavin et al. .................. 324/309
6,587,708 B2 * 7/2003  Venkatesan et al. .......... 600/419
7,046,004 B2 * 5/2006  Bieri et al. .................... 324/307
2011/0215804 A1* 9/2011  Deimling et al. ............. 324/307

FOREIGN PATENT DOCUMENTS

DE    10 2008 011 098 A1    4/2009

OTHER PUBLICATIONS

"Rapid Single Point (RASP) Imaging," Heid et al., SMR, 3$^{rd}$ Annual Meeting, p. 684 (1995).

* cited by examiner

*Primary Examiner* — Dixomara Vargas
(74) *Attorney, Agent, or Firm* — Schiff Hardin LLP

(57) ABSTRACT

In a magnetic resonance method and system to create a difference image, essentially only one k-space point in a k-space data set belonging to the difference image is acquired at least twice in the form of k-space measurement values after a radiation of an RF excitation pulse. The difference image is thereby created depending on acquired k-space data set by means of taking the difference of the respective at least two results acquired per k-space point. For each essentially only one k-space point shift multiple phase coding gradients are activated in respective spatial directions, followed by a first readout of the essentially only one k-space point for an acquisition of a first of the k-space measurement values. The phase coding gradients are subsequently modified such that a gradient moment for each of the phase coding gradients is zero for a time period from the first readout of the essentially only one k-space point up to a second readout of the essentially only one k-space point. The essentially only one k-space point is subsequently read out a second time.

15 Claims, 3 Drawing Sheets

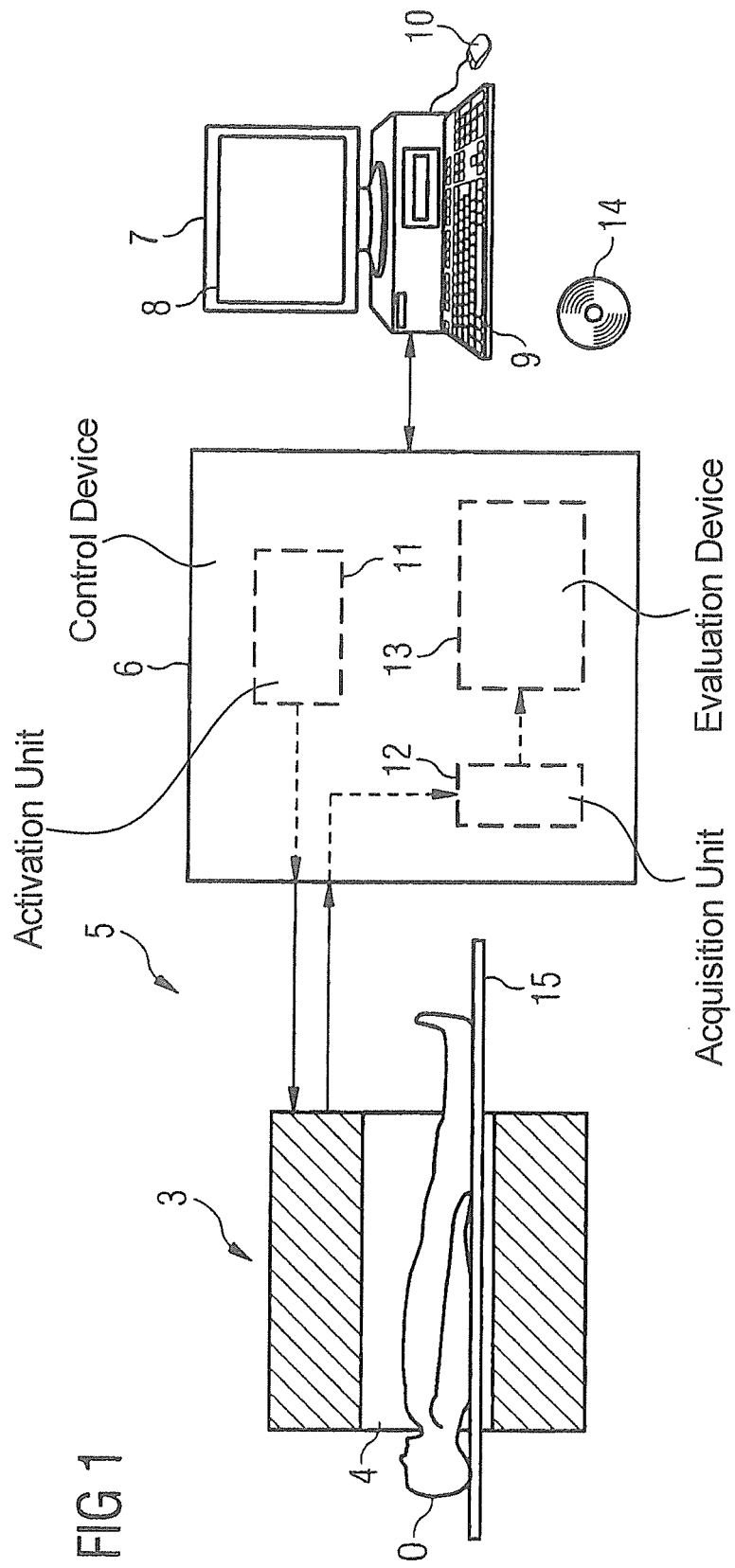

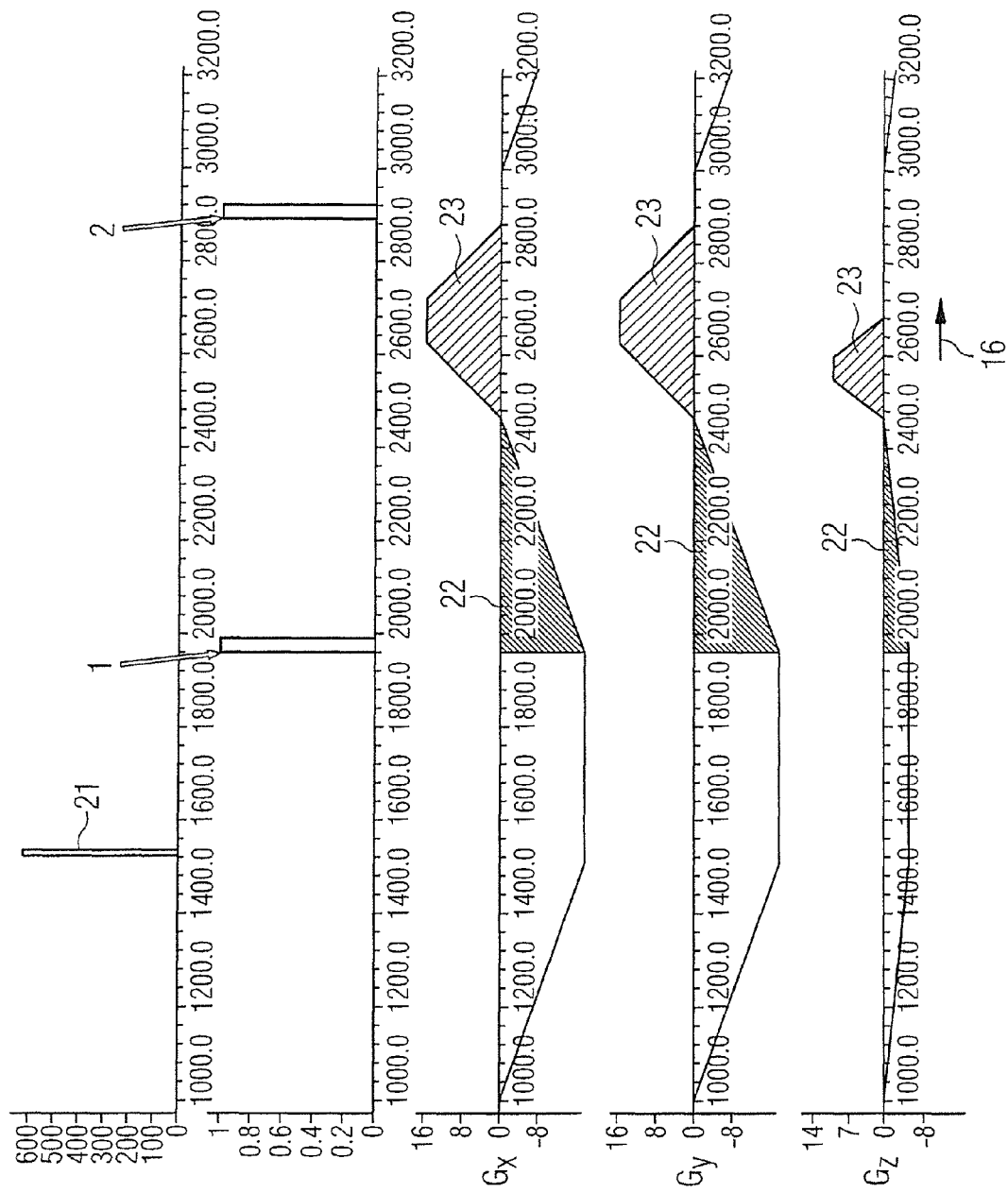

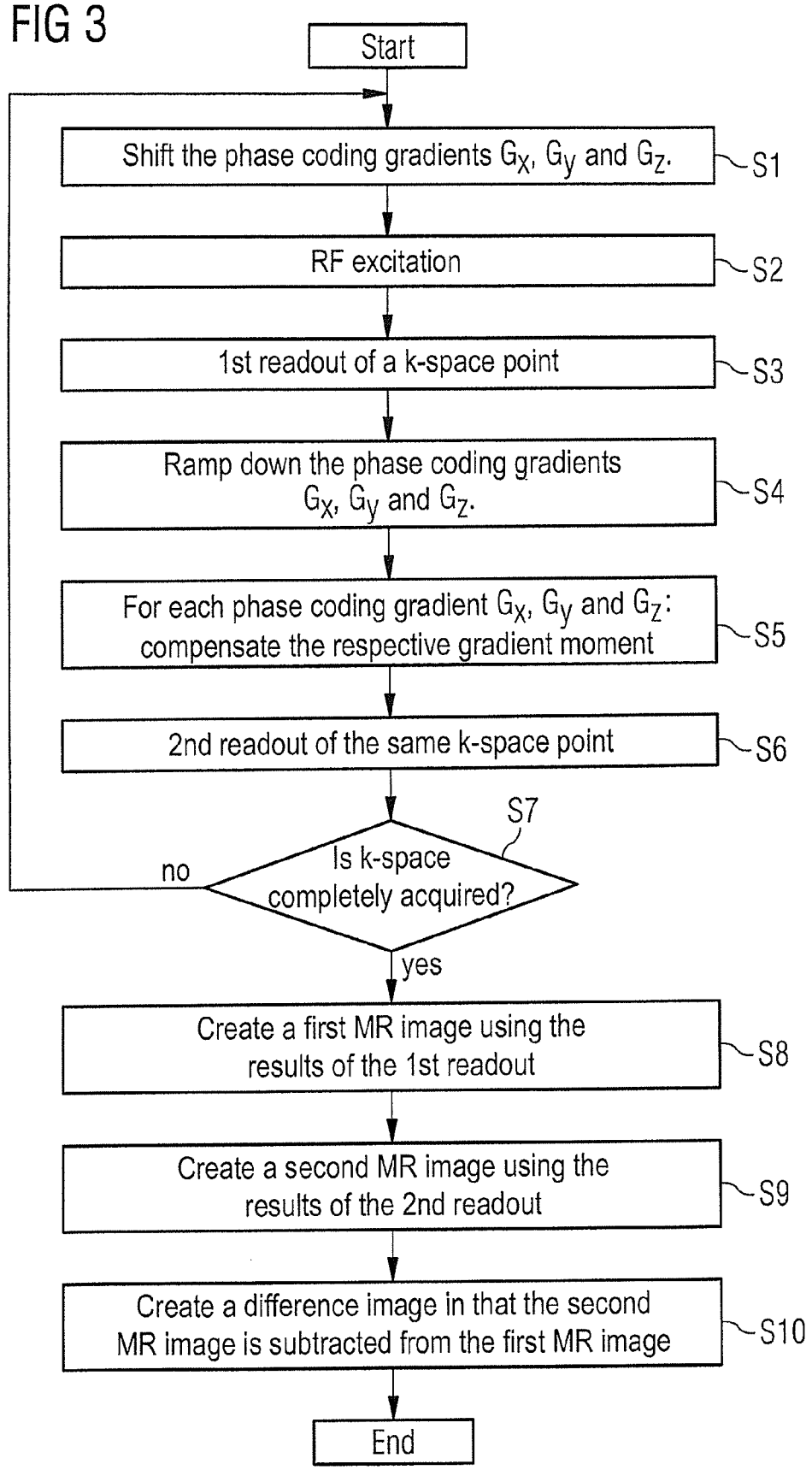

MAGNETIC RESONANCE METHOD AND SYSTEM TO CREATE AN IMAGE DATA SET

BACKGROUND OF THE INVENTION

1. Field of the Invention

The present invention concerns a method to create a difference image of two MR images by means of a magnetic resonance system. Moreover, the present invention concerns a correspondingly designed magnetic resonance system as well as a corresponding non-transitory electronically readable data storage medium.

2. Description of the Prior Art

New fields of application in magnetic resonance tomography are offered by the acquisition of MR data with very short echo times (<500 µs). It is thereby possible to show substances or tissue that cannot be shown by means of conventional sequences—for instance a (T)SE sequence ("(Turbo) Spin Echo") or a GRE sequence ("Gradient Echo")—since their T2 time is markedly shorter than the echo time and thus a corresponding signal from these substances or tissues has already decayed at the point in time of acquisition. For example, with echo times in the range of the corresponding decay time, it is possible to show bones, teeth or ice in an MR image although the T2 time of these subjects is in a range from 30-80 µs.

Sequences are known that enable a very short echo time. In addition to the radial UTE sequence ("Ultrashort Echo Time") there is the approach to scan k-space at points at which the free induction decay (FID) is detected. Such a method is also designated as single point imaging since essentially only one raw data point or k-space point in k-space is detected per RF excitation.

One example of such a method for single point imaging is the RASP method ("Rapid Signal Point (RASP) Imaging", O. Heid, M. Deimling, SMR, 3rd Annual Meeting, Page 684, 1995). According to the RASP method, a raw data point in k-space, whose phase was coded by gradients, is read out at a fixed point in time after the RF excitation relative to the "echo time" TE. The gradients are modified by means of the magnetic resonance system for each raw data point or measurement point, and k-space is thus scanned point-by-point.

According to the prior art, to create an image that shows only substances or tissue that have a very short T2 time (for example bone), it is typical to implement the RASP method twice, with the RASP method operating with such a short echo time TE in the first pass that bones, for example, still deliver a signal and with the RASP method operating with a correspondingly longer echo time TE in the second pass so that the bones no longer deliver a signal. Each pass of the RASP method respectively provides an image, so two images that are created in such a manner are subtracted from one another so that only tissues or substances having a very short T2 time are still shown in the resulting difference image.

SUMMARY OF THE INVENTION

An object of the present invention is to generate such a difference image more quickly (with a shorter total measurement time) than is possible according to the prior art.

This object is achieved in accordance with the present invention by a method to create a difference image with a magnetic resonance system wherein essentially only one k-space point in a k-space data set associated with the difference image is detected at least twice after a radiation of an RF excitation pulse. For this purpose, either two or three phase coding gradients are activated in respective spatial directions and the essentially only one k-space point is read out the first time after the radiation of the excitation pulse. The phase coding gradients are subsequently modified such that a gradient moment for each of the phase coding gradients is equal to zero for a time period from the first readout of the essentially only one k-space point until a second readout of the essentially only one k-space point. Because this condition (gradient moment is equal to zero) is satisfied for each of the phase coding gradients, the essentially only one k-space point is read out the second time without an additional RF excitation pulse having to be radiated.

According to the invention, the MR data in k-space are detected accordingly by means of a single point imaging in which normally only one measurement point or, respectively, k-space point is acquired (also more than once) per phase coding step (activating of the phase coding gradients). A radio-frequency pulse is generated for excitation, and a single measurement point in k-space is scanned at least twice after this excitation, namely the free induction signal is detected at least twice. Due to the direct or pure phase coding (by means of the phase coding gradients) for spatial coding, single point imaging is nearly unaffected by inhomogeneities of the B0 field, by variations of the magnetic susceptibility and by artifacts of the chemical shift.

Because not just one result but rather multiple results for the corresponding k-space point are acquired per RF excitation pulse, after an implementation of the method according to the invention, multiple MR images can advantageously be constructed in essentially one pass for all points of k-space to be scanned. According to the prior art (for example with the RASP method) multiple passes are necessary for this, such that the measurement time in the present invention is at least halved in comparison to the prior art. Advantageously, arbitrarily many MR images with different echo times can be created with only one implementation with the method according to the invention.

Beginning at the first readout, the phase coding gradients are respectively ramped down to zero so that the gradient moment for each of the phase coding gradients is equal to zero in the time period from the first readout to the second readout.

If the phase coding gradients exhibit an additional curve after being ramped down to zero, such that a gradient moment which was created by the down-ramp is compensated, the down-ramping of the phase coding gradients offers the possibility to implement the second readout as close in time as possible after the first readout.

After the down-ramping the phase coding gradients are advantageously respectively shifted such that at the down-ramping they have an inverted value in comparison to the respective phase coding gradient. This means that, if the respective phase coding gradient is ramped down from a positive (negative) value in the down-ramping, after the down-ramping the corresponding phase coding gradient has a negative (positive) value to compensate the gradient moment that is created in the down-ramping.

It is thereby ensured that the gradient moment created in the down-ramping can advantageously be compensated quite quickly in order to read out the same k-space point the second time.

In order to read out the same k-space point a third, fourth etc. time, the phase coding gradients advantageously remain deactivated as soon as the gradient moment has the value of zero after [since] the first readout.

According to the invention, it would also be possible for the phase coding gradients not to be deactivated between the second and third readout, but respectively have a gradient moment of zero. It is important that the gradient moment for each phase coding gradient is zero from the first readout up to the respective additional readout.

According to the invention, the following possibilities exist:

A slice of k-space is selected via the RF excitation pulse. In this possibility the multiple phase coding gradients consist of two phase coding gradients which are used for spatial coding.

No slice of k-space is selected by the RF excitation pulse. In this possibility the multiple phase coding gradients consist of three phase coding gradients which are used for spatial coding.

According to a preferred embodiment of the invention, a first MR image is created using the results of the first readout of all k-space points to be read out from k-space. A second MR image is created in the same manner using the results of the second readout of the same k-space points. A difference image is created in that the values of the second image are subtracted pixel for pixel from the first image.

While signals of nearly all substances and tissues (including bones, teeth, ice) are contained in the results which are acquired in the first readout, only signals of substances and tissues which have a correspondingly long T2 time are contained in the results which are acquired in the second readout. Therefore the difference image contains only those substances and tissues which have such a short T2 time that they are no longer contained in the second image. For example, it is therefore possible for only bones to be shown in the difference image. For this it is sufficient if, for example, the second readout occurs somewhat longer than 400 µs after the RF excitation pulse (thus with an echo time of 400 µs) since the signal of bones has already decayed after this time (400 µs).

Within the scope of the present invention, a magnetic resonance system is also provided to create a difference image. The magnetic resonance system thereby has a control unit that operates (activates) a magnetic resonance scanner, an acquisition device to receive signals acquired by the scanner and an evaluation device to evaluate the signals and to create the difference image. The magnetic resonance scanner radiates an RF excitation pulse and acquires essentially only one k-space point in the associated k-space at least twice. The evaluation device creates the difference image based on the at least two results for each k-space point in k-space. To detect these results, the control unit shifts multiple phase coding gradients in a respective spatial direction for each essentially only one k-space point and reads out the essentially only one k-space point a first time. The control unit subsequently modifies the phase coding gradients such that the phase coding gradients respectively have a gradient moment of zero from the first readout until a second readout of the essentially only one k-space point. The control unit operates the magnetic resonance scanner to subsequently read out the essentially only one k-space point a second time.

The advantages of the magnetic resonance according to the invention significantly correspond to the advantages of the method according to the invention as described in detail above.

Furthermore, the present invention encompasses a non-transitory computer-readable storage medium encoded with programming (in particular, software) that can be loaded into a memory of a programmable controller or a computer of a magnetic resonance system. All embodiments of the method according to the invention that are described in the preceding can be executed with these programming instructions when the computer program product runs in the controller. The storage medium possibly requires program means (for example libraries and auxiliary functions) in order to realize the corresponding embodiments of the method. The software represented by the programming instructions can be a source code (C++, for example) that must still be compiled and linked or that only must be interpreted, or can be an executable software code that is only to be loaded into the corresponding computer for execution.

The data storage medium can be a DVD, a magnetic tape or a USB stick, for example, on which is stored the electronically readable control information, in particular software (see above).

The present invention is particularly suitable for methods of single point imaging. However, the present invention is naturally not limited to this preferred application field. For example, it is conceivable that the free induction signal is scanned repeatedly at successive, identical time intervals in the first readout, whereby multiple measurement points or k-space points in k-space are detected without the radio-frequency excitation pulse being regenerated every time to detect each of these measurement points, for example, as is the case in the "pure" single point imaging described in the preceding.

BRIEF DESCRIPTION OF THE DRAWINGS

FIG. 1 shows a magnetic resonance system according to the invention.

FIG. 2 shows the curve of the phase coding gradients for double acquisition of the same k-space point according to one embodiment of the invention.

FIG. 3 is a flowchart of an embodiment of the method according to the invention.

DESCRIPTION OF THE PREFERRED EMBODIMENTS

A magnetic resonance system 5 according to the invention is schematically shown in FIG. 1. The magnetic resonance system 5 has a scanner 3 with which the magnetic fields necessary for the MR examination are generated in a measurement space 4; a table 15; a control device 6 with which the scanner 3 is controlled and MR data of the scanner 3 are acquired, and a terminal 7 connected to the control device 6.

The control device 6 includes an activation unit 11, an acquisition device 12 and an evaluation device 13. During the generation an image data set, MR data are acquired by the acquisition device 12 by means of the scanner 3, wherein the scanner 3 and the table 2 are activated by the activation unit 11 such that MR data are acquired in a measurement volume which is located inside the body of a patient O lying on the table 2.

The evaluation device 13 then prepares the data such that they can be graphically presented on a screen 8 of the terminal 7, and such that images created according to the invention (in particular difference images) are displayed. In addition to the graphical presentation of the MR data, a three-dimensional volume segment to be measured can be predetermined by a user and additional parameters for implementation of the method according to the invention can be determined with the terminal 7, which in addition to the screen 8 comprises a keyboard 9 and a mouse 10. The software for the control device 6 can also be loaded into the control device 6 via the terminal 7. This software of the control device 6 implements the method according to the invention. It is also possible for the method according to the invention to be executed by software that runs in the terminal 7. Independently of in which software the method according to the invention is embodied, the software can be stored on a DVD 14 so that this software can then be read from the DVD 14 by the terminal 7 and either be copied into the control device 6 or into a computer of the terminal 7 itself.

The curve of the phase coding gradients $G_x$, $G_y$, $G_z$ over time 16 is shown in FIG. 2 in order to acquire the same k-space point twice, starting from an RF excitation pulse. It is apparent that the phase coding gradients $G_x$, $G_y$, $G_z$ constantly maintain the value that they have at the point in time of the radiation of the RF excitation pulse 21 up until the first readout 1. All three phase coding gradients $G_x$, $G_y$, $G_z$ are ramped down to zero at approximately the middle of the first readout pulse 1 during which the free induction signal (FID) is acquired by an analog-digital converter. The gradient moment 22, which arises at the down-ramping of the respective phase coding gradients, is subsequently compensated by the same gradient moment 23, but with a reverse sign, being generated for the respective phase coding gradients (the area designated with the reference character 22 has the same magnitude as the area designated with the reference character 23). Since the gradient moment 22, 23 which the respective phase coding gradient generates from the first readout 1 up to the beginning of the second readout 2 has a value of zero, the same k-space point is read out at the second readout 2 as at the first readout 1.

If the phase coding gradients remain deactivated, it would be possible to read out the same k-space point a third time, a fourth time and further times. The time period between the RF excitation pulse 21 and the respective readout 1, 2 thereby indicates the respective echo time TE. A third or fourth readout or more readouts can accordingly always have a longer echo time than the preceding readout.

A flow chart of a method according to the invention is shown in FIG. 3.

After the start three phase coding gradients $G_x$, $G_y$, $G_z$ are switched (activated) in Step S1, which phase coding gradients $G_x$, $G_y$, $G_z$ are then kept constant from the RF excitation (Step S2) up to the first readout of a k-space point in Step S3. In the method shown in FIG. 3, the spatial coding accordingly occurs in all three spatial directions respectively with the three phase coding gradients $G_x$, $G_y$, $G_z$.

During the first readout the three phase coding gradients $G_x$, $G_y$, $G_z$ are ramped down in Step S4, and in Step S5 the gradient moment which the respective phase coding gradient $G_x$, $G_y$, $G_z$ generate during the down-ramping in Step S4 is compensated by a corresponding curve of the respective phase coding gradients $G_x$, $G_y$, $G_z$. The curve of the phase coding gradients $G_x$, $G_y$, $G_z$ in Steps S4 and S5 thereby corresponds to the curve of the phase coding gradients $G_x$, $G_y$, $G_z$ in FIG. 2 between the first readout 1 and the second readout 2.

The k-space point that was already acquired in the first readout is read out for a second time in Step S6. In the next Step S7 it is checked whether k-space has been completely acquired. This is the case if all k-space points to be acquired in k-space have been acquired. It is noted that it is not absolutely necessary to detect all (possible) k-space points in order to completely acquire k-space, since one or another k-space point cannot be acquired in border regions of k-space and its MR data can be determined via the MR data of its acquired neighbors, for example.

If k-space has not yet been completely acquired ("no" in Step S7), the method returns again to Step S1 in which the phase coding gradients $G_x$, $G_y$, $G_z$ are set to a different value (at least one of the phase coding gradients is set to a different value than in the preceding Step S1) in order to acquire the next k-space point.

If k-space has been completely acquired ("yes" in Step S7), the upper loop is exited and in Step S8 a first MR image is created depending on the results of the first readout. In the following Step S9 a second MR image is created depending on the results of the second readout, and in Step S10 a difference image is created in that (for example) the second MR image is subtracted per pixel from the first MR image. The method according to the invention is subsequently ended.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate a magnetic resonance difference image, comprising the steps of:
    exciting nuclear spins in an examination subject to cause emission of magnetic resonance signals from the examination subject;
    phase coding said magnetic resonance signals by activating multiple phase coding gradients respectively in different spatial directions;
    reading out the phase coded magnetic resonance signals as values respectively entered into k-space at k-space points;
    for each of said k-space points, implementing said readout by conducting a first readout wherein a first value for that k-space point is entered into k-space, to produce a first k-space data set for said readout, modifying said multiple phase coding gradients to cause the gradient moment for each of said multiple phase coding gradients to zero for a time period from said first readout to a subsequent point in time and, at said subsequent point in time, conducting a second readout of the k-space point, to produce a second set of k-space data for said second readout; and
    in a computerized processor, generating a magnetic resonance difference image as a difference between said first set of k-space data and said second set of k-space data.

2. A method as claimed in claim 1 comprising modifying said multiple phase coding gradients by down-ramping each of said multiple phase coding gradients to zero, at a time substantially coinciding with said first readout.

3. A method as claimed in claim 2 comprising down-ramping each of said multiple phase coding gradients to compensate the respective gradient moment thereof by said down-ramping to give each down-ramped phase coding gradient a compensating negative value compared to that phase coding gradient before said down-ramping.

4. A method as claimed in claim 1 comprising maintaining said multiple phase coding gradients deactivated after said second readout, and implementing at least one additional readout of each k-space point after said second readout.

5. A method as claimed in claim 1 comprising activating three phase coding gradients as said multiple phase coding gradients and emitting said RF excitation pulse non-slice selectively.

6. A method as claimed in claim 1 comprising activating two phase coding gradients as said multiple phase coding gradients and emitting said RF excitation pulse slice-selectively.

7. A method as claimed in claim 1 comprising generating said difference image by generating a first image from said first k-space data set and generating a second image from said second k-space data set and forming said difference image as a difference between said first image and said second image.

8. A magnetic resonance system to generate a magnetic resonance difference image, comprising:
    a magnetic resonance data acquisition unit;

a computerized control unit configured to operate said data acquisition unit to excite nuclear spins in an examination subject in said acquisition unit to cause emission of magnetic resonance signals from the examination subject;

said control unit being configured to operate said data acquisition unit to phase code said magnetic resonance signals by activating multiple phase coding gradients respectively in different spatial directions;

said control unit being configured to operate said data acquisition unit to read out the phase coded magnetic resonance signals as values respectively entered into k-space at k-space points;

said control unit being configured to operate said data acquisition unit to, for each of said k-space points, implement said readout by conducting a first readout wherein a first value for that k-space point is entered into k-space, to produce a first k-space data set for said readout, modifying said multiple phase coding gradients to cause the gradient moment for each of said multiple phase coding gradients to zero for a time period from said first readout to a subsequent point in time and, at said subsequent point in time, conducting a second readout of the k-space point, to produce a second set of k-space data for said second readout; and a computerized processor configured to generate a magnetic resonance difference image as a difference between said first set of k-space data and said second set of k-space data.

9. A magnetic resonance system as claimed in claim 8 wherein said control unit being configured to operate said data acquisition unit to modify said multiple phase coding gradients by down-ramping each of said multiple phase coding gradients to zero, at a time substantially coinciding with said first readout.

10. A magnetic resonance system as claimed in claim 9 wherein said control unit being configured to operate said data acquisition unit to down-ramp each of said multiple phase coding gradients to compensate the respective gradient moment thereof by said down-ramping to give each down-ramped phase coding gradient a compensating negative value compared to that phase coding gradient before said down-ramping.

11. A magnetic resonance system as claimed in claim 8 wherein said control unit being configured to operate said data acquisition unit to maintain said multiple phase coding gradients deactivated after said second readout, and implementing at least one additional readout of each k-space point after said second readout.

12. A magnetic resonance system as claimed in claim 8 wherein said control unit being configured to operate said data acquisition unit to activate three phase coding gradients as said multiple phase coding gradients and emit said RF excitation pulse non-slice selectively.

13. A magnetic resonance system as claimed in claim 8 wherein said control unit being configured to operate said data acquisition unit to activate two phase coding gradients as said multiple phase coding gradients and emit said RF excitation pulse slice-selectively.

14. A magnetic resonance system as claimed in claim 8 wherein said computerized processor is configured to generate said difference image by generating a first image from said first k-space data set and generating a second image from said second k-space data set and forming said difference image as a difference between said first image and said second image.

15. A non-transitory computer-readable storage medium encoded with programming instructions, said storage medium being loadable into a computerized operating and image reconstruction system of a magnetic resonance apparatus having a magnetic resonance data acquisition unit, and said programming instructions causing said computerized operating and image reconstruction system to:

operate said data acquisition unit to excite nuclear spins in an examination subject to cause emission of magnetic resonance signals from the examination subject;

operate said data acquisition unit to phase code said magnetic resonance signals by activating multiple phase coding gradients respectively in different spatial directions;

operate said data acquisition unit to read out the phase coded magnetic resonance signals as values respectively entered into k-space at k-space points;

operate said data acquisition unit to, for each of said k-space points, implement said readout by conducting a first readout wherein a first value for that k-space point is entered into k-space, to produce a first k-space data set for said readout, modifying said multiple phase coding gradients to cause the gradient moment for each of said multiple phase coding gradients to zero for a time period from said first readout to a subsequent point in time and, at said subsequent point in time, conducting a second readout of the k-space point, to produce a second set of k-space data for said second readout; and generate a magnetic resonance difference image as a difference between said first set of k-space data and said second set of k-space data.

* * * * *